US009324032B2

(12) United States Patent
Jones et al.

(10) Patent No.: US 9,324,032 B2
(45) Date of Patent: Apr. 26, 2016

(54) METHOD OF CREATING A COMPUTER MODEL OF THE PHYSICAL WORLD

(75) Inventors: David Scott Jones, Fife (GB); Russell William Kay, Dundee (GB); Michael Dailly, Dundee (GB); Luke Joseph Halliwell, Dundee (GB); Jacques Bruno Michel Menuet, Dundee (GB); Jonathan Sinclair Hughes, Fife (GB); Oliver Norton, Dundee (GB); Jonathan Ball, Dundee (GB); William Henderson, Dundee (GB)

(73) Assignee: Real-Time Worlds, Ltd., Dundee (GB)

( * ) Notice: Subject to any disclaimer, the term of this patent is extended or adjusted under 35 U.S.C. 154(b) by 709 days.

(21) Appl. No.: 12/682,029

(22) PCT Filed: Oct. 8, 2008

(86) PCT No.: PCT/GB2008/003411
§ 371 (c)(1),
(2), (4) Date: Jun. 7, 2011

(87) PCT Pub. No.: WO2009/047502
PCT Pub. Date: Apr. 16, 2009

(65) Prior Publication Data
US 2012/0095945 A1 Apr. 19, 2012

(30) Foreign Application Priority Data

Oct. 8, 2007 (GB) .................................. 0719625.6

(51) Int. Cl.
G06N 7/06 (2006.01)
G06N 5/00 (2006.01)
G06T 17/05 (2011.01)

(52) U.S. Cl.
CPC .. *G06N 7/06* (2013.01); *G06N 5/00* (2013.01); *G06T 17/05* (2013.01); *G06T 2210/08* (2013.01)

(58) Field of Classification Search
CPC ............ G06N 7/06; G06N 5/00; G06T 17/05; G06T 2210/08
See application file for complete search history.

(56) References Cited

U.S. PATENT DOCUMENTS

| 5,966,140 | A | * | 10/1999 | Popovic et al. | 345/441 |
| 6,081,278 | A | * | 6/2000 | Chen | 345/473 |
| 6,112,279 | A | * | 8/2000 | Wang | 711/119 |
| 6,192,408 | B1 | * | 2/2001 | Vahalia et al. | 709/229 |
| 6,421,051 | B1 | * | 7/2002 | Kato | 345/428 |
| 6,608,628 | B1 | * | 8/2003 | Ross et al. | 345/619 |

(Continued)

FOREIGN PATENT DOCUMENTS

WO WO 2005/006118 A2 1/2005

OTHER PUBLICATIONS

A Scaleable Approach to Vizualization of Large Virtual Cities, by Zara et al., published 2001.*

(Continued)

*Primary Examiner* — Jeffrey A Gaffin
*Assistant Examiner* — Thomas Fink
(74) *Attorney, Agent, or Firm* — Hickman Palermo Becker Bingham LLP

(57) ABSTRACT

A method of executing a computer application in the context of a computer model comprising the steps of retrieving computer model data from a model server, retrieving application information from an application server, and executing said application information in the context of the model in an execution environment.

20 Claims, 14 Drawing Sheets

(56) References Cited

U.S. PATENT DOCUMENTS

| | | | |
|---|---|---|---|
| 6,704,791 B1* | 3/2004 | Harris | 709/231 |
| 7,269,632 B2* | 9/2007 | Edeker et al. | 709/217 |
| 8,035,636 B1* | 10/2011 | Yang | 345/419 |
| 2003/0151605 A1* | 8/2003 | Dominici | 345/419 |
| 2005/0026692 A1* | 2/2005 | Dyl | 463/42 |
| 2005/0128212 A1* | 6/2005 | Edecker et al. | 345/582 |
| 2005/0264566 A1* | 12/2005 | Sommers | 345/423 |
| 2007/0129125 A1* | 6/2007 | Van Luchene | 463/1 |
| 2007/0236502 A1* | 10/2007 | Huang et al. | 345/473 |

OTHER PUBLICATIONS

Mao Chen et al., "RoboCup Soccer Server", Users Manual, for Soccer Server Version 7.07 and later, XP-002531705, dated Aug. 2, 2002, 100 pages.

Conradi Reidar et al., "Version Models for Software Configuration Management", XP-002463369, Dated Aug.-Oct. 1995, 60 pages.

Laue, Tim et al., "SimRobot—A General Physical Robot Simulator and Its Application in RoboCup", dated 2006, 12 pages.

Luo Yuhua et al., "Cooperative Design for 3D Virtual Scenes", IEEE, Dated 1998, 10 pages.

\* cited by examiner

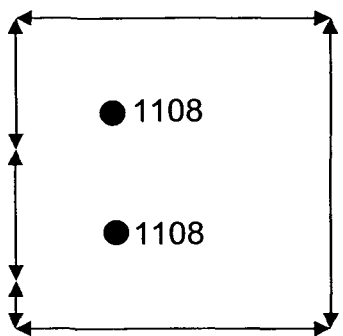
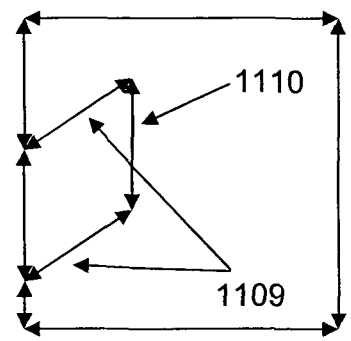
FIGURE 11D  FIGURE 11E
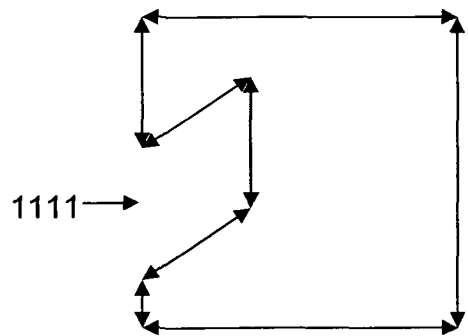
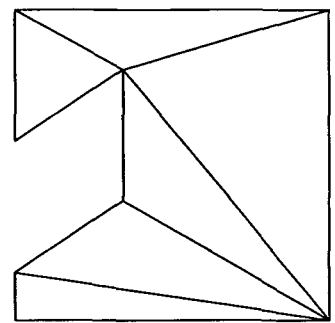
FIGURE 11F  FIGURE 11G

METHOD OF CREATING A COMPUTER MODEL OF THE PHYSICAL WORLD

This invention relates to computer modelling of the real world. In one aspect it is suitable for real-time modelling of locations of the world whereby users co-operate to populate the modelled world according to their local knowledge.

BACKGROUND TO THE INVENTION

The computer modelling of environments is traditionally based on artificial constructs from the imagination of the environment creator. Being artificial, they require significant effort investing in their creation, usually in the form of artistic talent and time from the development team.

Due to the large amounts of data that require processing in order to create such an environment, the results tend to depend on the resources and processing power available to the end user group and the limitations of the supporting databus or network. This limitation will affect either the extent or quality of the model environment or the cost of the hardware required to process the environment.

For example, in the case of processing power limitation, the rendering of the environment may suffer during particularly processor intensive scenes. This often results in frame rate slow down, a particularly unwanted side-effect during, for example, a game where users are interacting with each other requiring accurate collision detection for a satisfactory user experience. Slow down also reinforces the perception that the environment is artificial. The problem occurs both at the level of creation of the environment as a whole and at the level of creation of individual environment components such as buildings.

SUMMARY OF THE INVENTION

According to a first aspect of the present invention there is provided a method as defined in claim 1 of the appended claims.

By providing a world server and application server, the invention thus reduces the amount of data requiring processing in order to render the environment. This also benefits interaction on-line between users of the artificial environment where the bandwidth of a network or internet access may cause problems with the user experience.

By combining real world data from multiple sources, the accuracy of the physical world model is enhanced.

By expressing component parameters using a parametric description, data is thus represented at a higher level than raw polygons. Greater power and simplicity is afforded on a component editor executed in a component creation environment and the model world rendered in a client execution environment. Reduced data flow on the architecture supporting the environments and easily scalable rendering according to the resources available in the use environments allows the processing of larger datasets at each endpoint.

By identifying underlying terrain to be cut away and melding terrain into the resulting component gap, greater fidelity is achievable when rendering the model world for close-up viewing.

According to this aspect, a distributed creation environment is provided. Furthermore, by creating an artificial world based on the physical world where the user experience is enhanced especially if a particular user is familiar with the location in the environment being viewed, users are likely to take an active interest in the accuracy of the rendering of a location in the artificial world if they have local knowledge of the same location in the physical world. Components are therefore modelled based on their real life counter-parts and bear a recognisable resemblance to them enabling users to identify locations in the model world with locations in the real world.

With all the aspects of the invention, preferable, optional, features are defined in the dependent claims.

BRIEF DESCRIPTION OF THE DRAWINGS

Embodiments of the invention will now be described, by way of example only, and with reference to the drawings in which:

FIGS. 11*a*-11*g* show various steps involved in stitching a component to the underlying terrain.

In the figures, like elements are indicated by like reference numerals throughout.

DETAILED DESCRIPTION OF PREFERRED EMBODIMENTS

The present embodiments represent the best ways known to the applicants of putting the invention into practice. However, they are not the only ways in which this can be achieved.

In overview, an efficient way of facilitating creation and rendering of a computer model of the physical world requiring a reduced number of data transactions on the supporting hardware architecture is described herein. Reduced data flow allows the user execution environment, for example a high-end PC or a mobile platform to have less of an impact on model performance via scalable rendering according to the resources available to the user. This allows the processing of larger datasets at each endpoint. As a result, the perceived reality by the user is enhanced by providing a more realistic model with respect to the frame-rate of display in the user execution environment. Real-time, physical-world data may also be superimposed onto the computer model to further enhance the user experience, and a user may utilise local knowledge to populate the model with components from the same location in the physical world.

Figure 1A:
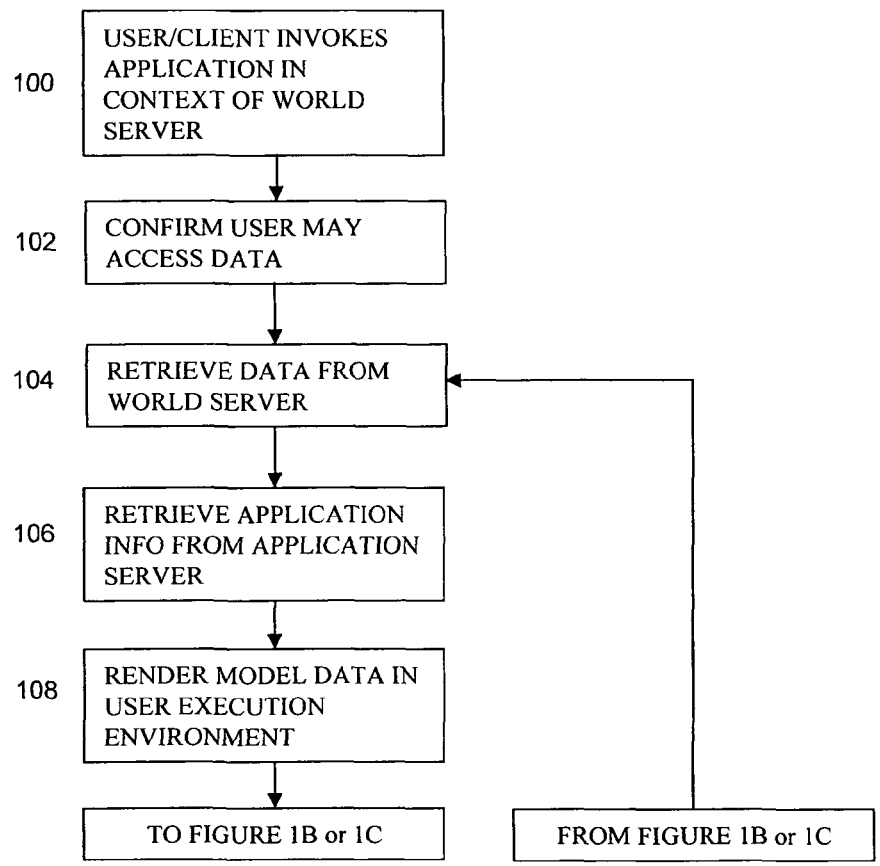
FIG. 1 illustrates a general overview of a method of enabling a community of users to efficiently update a computer world model.

Referring to FIG. 1A, a general overview of a method of enabling a community of users to efficiently update a computer world model is illustrated in the context of an application such as a component creation application for use in a world model stored at a world server. At step 100, a user/client invokes from an application server, a particular application in the context of the world server, for example a component creation application, and the user is verified as having the required rights to access the data at step 102. If the required rights are available, data is retrieved from the world server at step 104. Application data is retrieved from the application server by the user client at step 106. The computer model world data currently viewable is rendered according to the user execution environment at step 108 in the context of the invoked application.

As described in more detail below, using the component creation application, the user is able to populate a world model component with appropriate information allowing update of the world model. For example, the user may select a building as a component and enhance the building with additional visual details.

This method of updating a computer world model provides the ability, subsequently, for community members to vote upon changes made to components of the computer world model made by fellow community members. The voting system is a means of handing control and moderation of the development of the computer model world to the community, based on the component template provided.

Figure 1B:
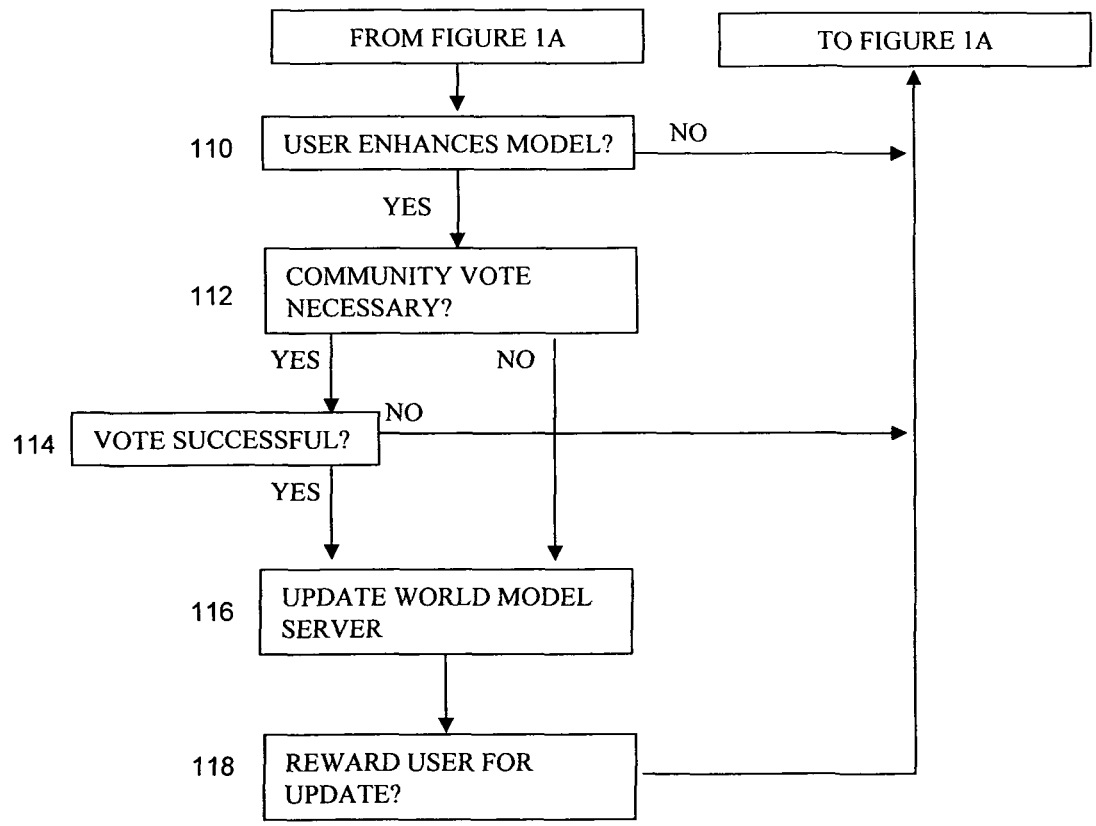

In one up-front method of voting, whereby voting occurs prior to the acquisition of the new content by the user, FIG. 1B shows that if a user desires to populate the template with a user enhanced or defined component at step 110, a parametric descriptor expressing parameters of the component in question is acquired from the user and a community vote may be initiated at step 114 if it is determined necessary at step 112. If the community vote is a success or a vote is not required, the computer model world server is updated with the new component data at step 116. This enables a single shared version of the model world common to all users which is moderated by a voting system.

Furthermore, as an incentive to, for example, populate the computer model world terrain with accurate representations of the real world, or to participate in relevant votes, value such as in-game economic value may be apportioned to transactions occurring within the computer world model at step 118 and the remote user profile updated accordingly. This is therefore a good way to encourage population of the computer model (and hence the game world on which applications such as but not limited to games are invoked).

Figure 1C:
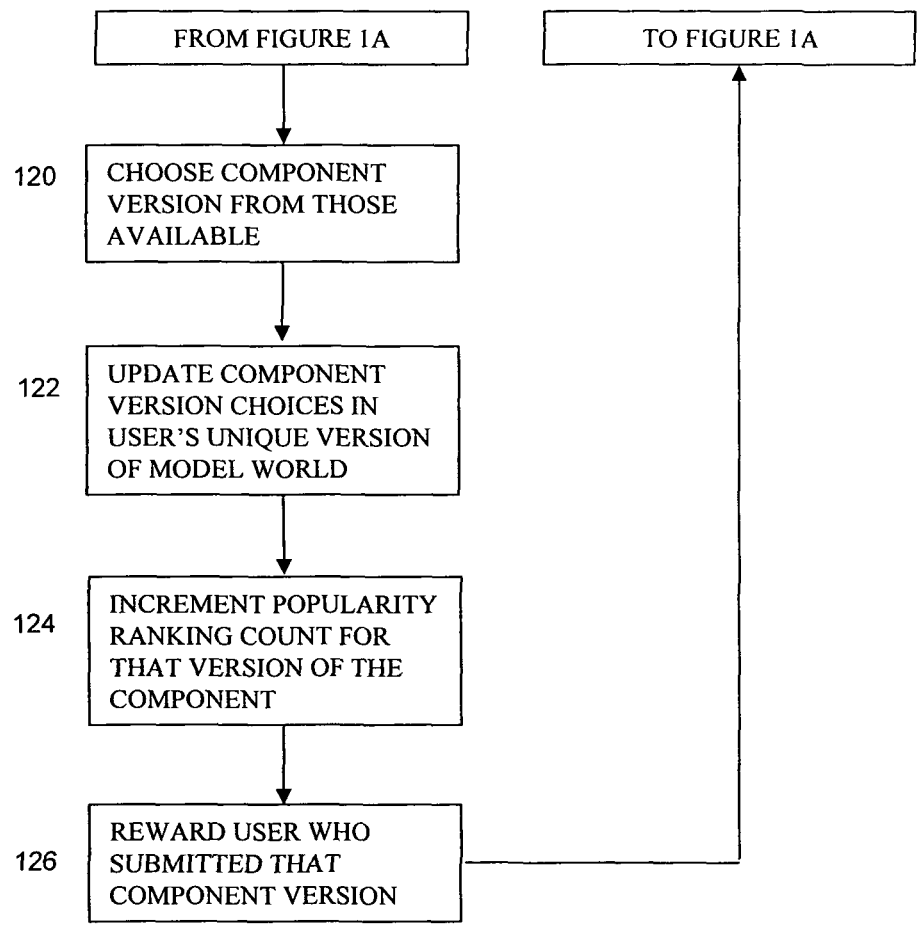

In an alternative method of voting as shown in FIG. 1C, each user can build a unique version of the computer model world. For each component footprint, every user chooses the version of each component they wish to populate their unique version of the computer model world with at step 120. Every version of a component submitted by other users for that component footprint (including some auto-generated ones) may be selected between. Once selected, the component appears in their unique version of the computer model world at step 122. Upon each instance of a user selecting a particular component, that component receives a vote at step 124, hence increasing its popularity ranking. A 'most popular' version of the world may therefore be determined by the system by counting the votes for each version of a component. The popularity rating affects how the various component versions are presented to a user for the purpose of selecting the desired version.

Furthermore, to encourage population of the model world with components of increasing quality, a user who has submitted a component subsequently selected by another user receives a reward, such as in-game economic value at step 126.

Additionally, a user may create their own version of a component using the component editor, and submit that version to the system, where it may become available for other users to select and add to their world.

The world server stores all component versions submitted by all users, and the users choose which ones they want to see in their own unique version of the computer model world. In this way, submission of erroneous or spurious components will usually result in that component being ignored by other users. In turn, the popularity rating of the component will change and influence whether other users subsequently select that component.

Furthermore, the system may alternatively or additionally override component selection by presenting to a user, a restricted set of components, the components of which may have been created by users of an application, for example a component creation application. This restricted set may be selected as a result of a previous vote, or other system parameters, and may subsequently be subjected to a user vote as described above. In this manner, the system maintains control over which components may be chosen by users, populated in their version of the model world, and hence subjected to a vote. The component footprints available for selective component population may also be restricted by the system.

According to other aspects described in more detail below, the world model can be further updated in real-time with real world data from multiple sources and an enhanced architecture is provided allowing more efficient and scaleable use of data.

Figure 2:
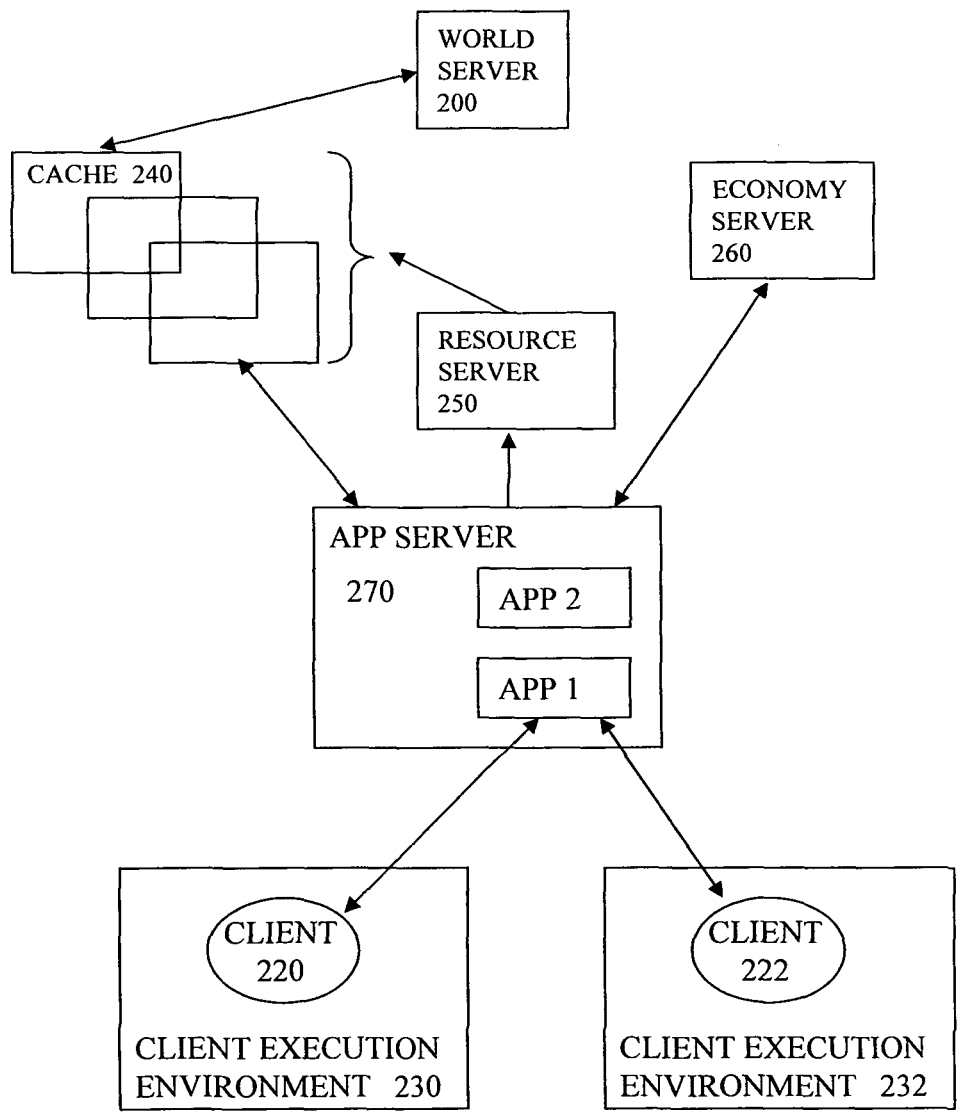
FIG. 2 illustrates client-server topology for implementing the computer world model.

Turning to a more detailed description of the embodiments with reference to FIG. 2, a client-server network system 20 for implementing the computer model of the physical world is illustrated comprising a world server 200 containing computer world model data based on, for example, but not limited to, cartographic, topographic or geographic information. The term server relates to any arrangement of hardware and/or software and may be implemented across many physical entities, for example as a software server instance. The computer world model data is available for interrogation and, with the appropriate permissions, update upon request from at least one application server 210 for execution at the client/user execution environment 230. A series of cascading caches are provided as local data stores intermediate the servers and execution environment to reduce the volume of model data that must be directly accessible from the central world server. The application server 270 executes at least one application, for example, a component creation application 212, executed within the context of the computer world model stored on the world server. At least one remote user client 220 provides the client execution environment 230 for user interaction with the application and model world.

The client requires only dumb terminal knowledge of how to login to the application server, for example acting as a web browser, with all the data it requires passed to it for rendering according to the client execution environment. In order to reduce the amount of data a client must download, and hence the amount of data that must be handled by the supporting architecture of FIG. 2, cascaded data cache 240 acts as a local store of data whereby, once contained in the cache, a local client need not request the data again from the central world server. Furthermore, data that has been subsequently updated since loading into the cache may be labelled such that resource server 250 overwrites the labelled data with the new data. The local client thus need only download the updated data from the local cache rather than the whole model from the central world server. This cache arrangement also has the benefit of affording visibility of the updated data to other local clients, for example 222, who are operating off the same local cache cascade, irrespective of whether they are executing the same application. Hence, data transfer volume is again reduced.

Multiple applications—for example, in addition to component creating games based on the world model—may be executed in parallel on the same application server in the context of the world model. In this scenario, the applications may share cache updates, information and other application server resources to further economise data flow required between the world server resources and the local client and execution environment. Inter-application information sharing is also possible irrespective of whether the applications are normally related.

The user execution environment resources are dependent upon the platform from which an application is invoked. These environments will comprise differing capabilities with regards, but not limited to, display resolution, display size, processing power and memory capacity. Hence the application is scaled to the client-server platform providing a reduction in data transfer across all users. For example, when the client and server instances are on the same platform, the use of parametric descriptors as described in more detail below enables optimisation to reduce processing time if the transmission bus is considerably faster in one scenario compared to another. This would reduce the risk of frame rate slow down and hence reduced playability. The rendering of the computer world template and components therein is scaleable according to the resources of the execution environment as detected by the client. In a further example, for a PDA device, a server instance may render a scene and only transmit resulting imagery to the client at a resolution or level of detail corresponding to the limited amount of processing power available at the client. Yet further, each user will see their own "version" of the model world based on their own selection of components as discussed above.

As described above, an economy model or server 260 which again can be a physical or virtual server instance, is also provided which may be interrogated in order to apportion economic value onto a client transaction and update the remote user client account. This serves to reward or provide an incentive for users to undertake certain acts within the context of the world model, such as but not limited to, updating a model component with user data or can reflect the value of components or transactions in other applications running in relation to the world model. A user's profile will be updated via the client with a value according to the economy server which may equate to improved community standing, or game currency which may be spent in games or to gain access to games.

As a result of the architecture described it will be seen that distribution of the tasks is provided at the server level providing modularity and tailorability of the various aspects. In addition, data efficiency is maximised at the client and by use of platform dependent scaling and cascaded caches.

Figure 3:
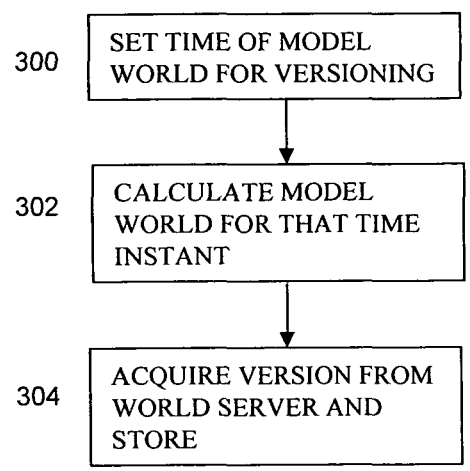
FIG. 3 shows a flow diagram of versioning

FIG. 3 illustrates a method of versioning whereby a snap shot of the model world can be taken at a definable instant in time that may be in the past, the present or the future. Each aspect of the model world is stored as a resource, for example retrievable from a resource database and including a resource identifier and a resource manifest comprising associated data, for example, in the form of metadata, allowing the aspect to be created in the model world and including for example, rendering information, associated real world information, economic value and so forth. At step 300, the time instant of the computer model to be taken is set on the world server. The world server calculates the model for that time instant if it has not been calculated previously at step 302, and the version comprising a snapshot of a relevant portion of the model world is acquired from the world server and stored in step 304 as meta-data in the resource manifest. If desired, this snapshot may be reloaded onto the world server or local cache for use with an application. Versioning is capable of providing historical versions of the model world representing the built environment at different points in time, or census and migration data and can also be used for predictive modelling such as consequences of planning permission applications and urban development or 'what if' scenarios such as disaster planning whereby the version is developed in parallel with other versions but based on an alternative set of subsequent data/events.

For example, referring back to FIG. 2, different clients, for example 220 and 222, although running in parallel in the context of the model world, may have access to a different version of the world model and can extrapolate a trend forward, or create different components. The differing versions of the model world are stored locally in the cascaded cache 240.

Returning to FIG. 1, user interaction in populating user-defined components at step 110 onto the components template of the world server will now be discussed in more detail. For reasons discussed above, the more populated an area of the model world is by users, the more realistic it will appear.

The computer model comprises a component template upon which user defined components such as buildings, whole estates of buildings (blanket creation and paint brushing of building styles), buildings with exaggerated parametric description for stylised game play, roads, bridges, tunnels and street furniture such as street lamps etc may be created. To allow for different degrees of artistic merit, and to keep a control on the amount of data flowing around the architecture each component is made up of one or more component features. The description of component features is defined in terms of at least one parameter expressable by a parameter descriptor per component feature. This parameter may be a visual, collision, physics engine or noise map parameter.

Figure 4:
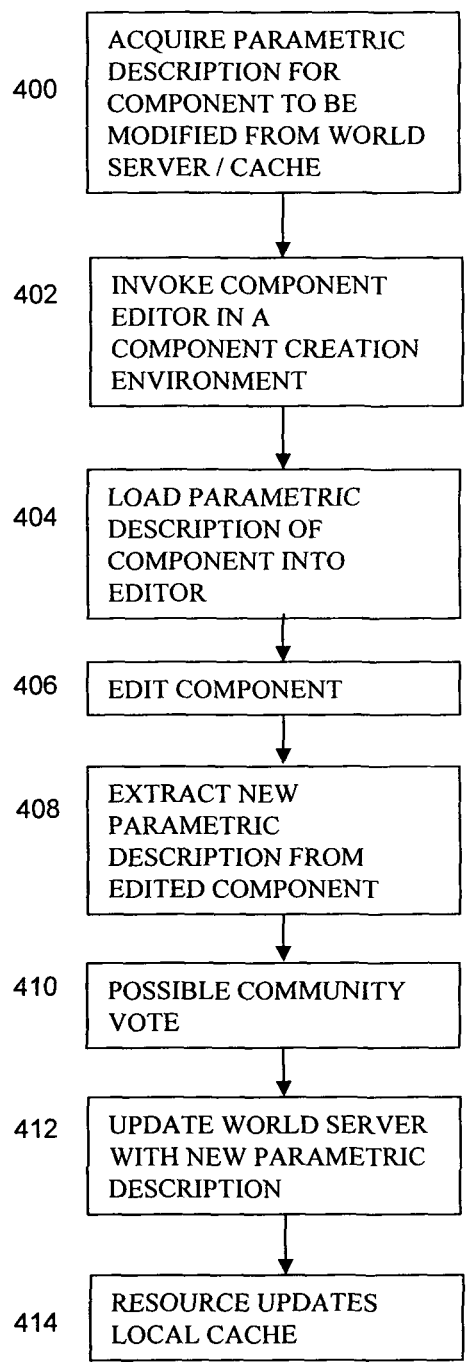
FIG. 4 shows a flow diagram of the method of user component creation.

FIG. 4 shows a flow diagram for creating a user defined component. At step 400, the component parametric description is acquired for the component in question from the world server or local cache. A component editor is then invoked in a component creation environment at step 402 followed by the parametric description of the component (step 404) to enable an accurate rendering of the component prior to editing at step 406 if required. Following editing by, for example, visual or graphical means, or simply entering new parameters if known, the parametric description of the edited component is extracted at step 408. The parametric description is then uploaded to the world server prior to possible approval from an upfront community vote at step 410 (see FIG. 5). If a new component is updated and accepted by a vote, as discussed in relation to FIG. 2, the old data is labelled at point 412 and the resource server will update the local cache accordingly at step 414. It will be noted that the component parameters may be derived automatically from a graphical representation of the component. The parameter descriptors, in effect, describe the method of constructing the component geometry comprising a flow chart or pipeline of steps known as nodes.

Referring to step 408 above, in the case of a building, an outline, for example from official data sources such as Ordnance Survey, forms the base of the building with which other parameter descriptors are associated to create the resultant parameter description of the building. For a simple form of building, a single node 'extrude outline' would only require one parameter for the height of the extrusion. Extra detail may be added such as doors and windows. In this case, the nodes 'add door' and 'add window' would comprise parameters describing the type of the door or window, and the position to insert it in the building. Higher level editing such as architectural style, type of stone used and whether to add a tower in the case of a church allows an inexperienced component creator to form a component easily with nodes comprising high-level parameters. The individual nodes and pipeline may be exposed to advanced users for direct editing, thus enabling a high degree of flexibility in component creation. Different levels of editing may be combined such as higher level editing to create a basic component quickly, followed by lower level editing to customise and refine the component. New node types may be added to extend the editing system and node types may be re-used for creating other components in the world other than buildings. The pipeline of nodes may be compiled directly into code for execution by clients that have a sufficient processing capability. These software functions for generating buildings are more compact than the building geometries themselves and hence require less information exchange on the supporting infrastructure.

When creating a road component, a road pipeline comprising a road spline network from an official data source, for example NavTeQ GPS navigation data, provides road topology and basic properties such as number and direction of lanes. Pipeline operations comprising specialist nodes for roads such as moving points, inserting new points, connecting roads and changing the curvature may be applied before spline refinement takes place.

Lane splines may be generated from the road splines to represent individual lanes of a road automatically and are fully customisable. This has the effect of breaking the generation process into smaller and more manageable steps. Different types of lanes such as traffic and pedestrian may be defined. Further operations may be placed in the road pipeline to additionally modify the lane splines allowing more flexibility than going straight from a road spline to a road geometry. Following the creation of the road splines, further nodes containing parameter descriptors to generate the physical features of the road such as the road surface, and pedestrian crossings may be used, resulting in a series of road component chunks that may be edited in the same way as a building component. For features such as lampposts, road markings and cats eyes occurring at regular intervals, a further node capable of creating a feature repetition is available. Features may be any size or shape. It will be seen that parametric representation of roads is utilised in the same way as for buildings hence avoiding the need for sending polygonal representations of roads or terrains to clients.

Figure 8:
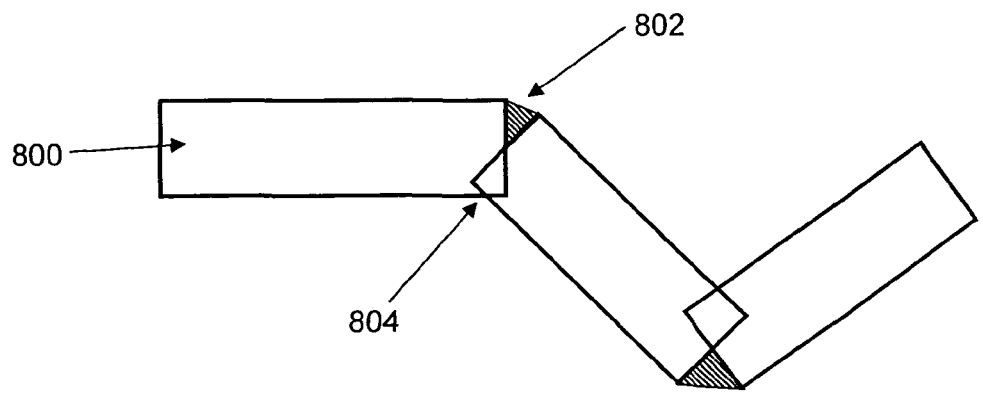
FIG. 8 shows a road components and corresponding joins therebetween.

Turning briefly to FIG. 8, a resultant road component 800 may appear as rectangular chunks that exhibit triangular cracks 802 on the outside of corners, while on the inside, the rectangular polygons overlap 804. At the time of rendering, and in order to remove visible seams between curving road sections, the triangular crack may be filled in and a common intersection point on the inside of the bend may be chosen to remove the overlap.

Figure 5:
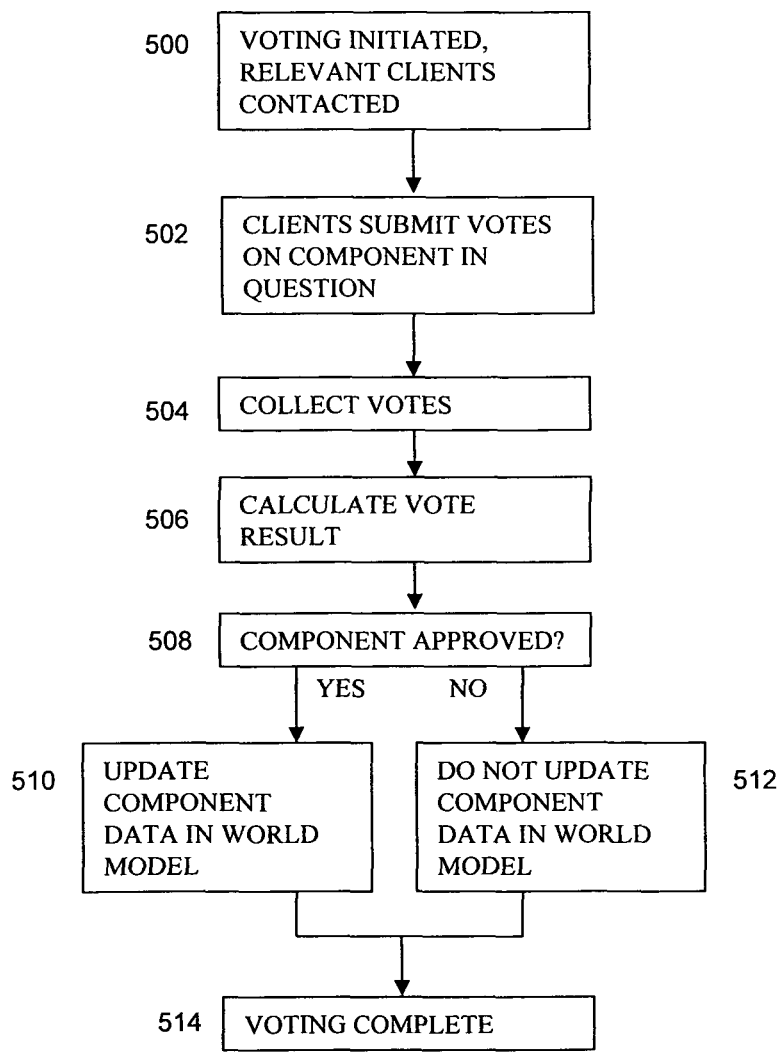
FIG. 5 shows a flow diagram of the community voting system.

Referring to FIG. 5, a community vote in line with the method described in relation to FIGS. 1A and 1B may be carried out in order to determine whether a user enhanced component should be incorporated into the model. At step 500, voting is initiated by contacting clients whose users are determined to have an interest in the component in question. This may be users of the application from which the component has been edited or a more general selection dependent on other parameters such as real-world geographical proximity. At step 502, users submit their vote following viewing the proposed component update in their own execution environment. This may also include viewing a photograph of the candidate building in order to compare the physical world building with the model world counter-part. A database submitted by users may be set up to hold photographs for viewing on request. The application server on which they invoke their execution environment collects their votes at step 504 and sends it to the central world server for collation and determination of the voting result at step 506.

The vote result may be calculated as a strict binary-type approval or disapproval, or as a fuzzy-type vote whereby the voter submits a rating between approval and disapproval on a sliding scale with the average over all votes counted determining either approval or disapproval. The threshold for approval or non-approval may be set anywhere between 100% approval or 100% disapproval with the vote hence provided as a weighted value. The votes can then be summed or averaged according to any desired criterion to assess whether the proposed change is acceptable. At steps 508 to 512, a successful component is updated onto the world server and local caches by the resource server mechanism as described above.

When a community vote in line with the method described in relation to FIGS. 1A and 1C is implemented, there may be user notification of new component versions and/or more popular versions being submitted for component footprints for which the user has already chosen a version, or for which the user has submitted an edit.

As explained in relation to FIG. 1C above, the user submits a vote as a result of selecting a version of a component from the version selection. Users may view images or photographs of components to aid in selection of a version. These photographs may be sourced through a database of user-submitted photographs or through external sources, or both.

With this method of voting, instead of one definitive component version which is replaced by instigating a binary vote, there may exist multiple versions each having a popularity rank based on the number of votes, and which can exist in a user version of the computer model world regardless of popularity rank, acting as a permanent ongoing poll rather than an election. Additionally, the results guide user choice rather than dictate user content. The results, however, do provide the data to create a definitive 'most-popular' version of the computer model world based on user-generated and user-voted content. However, this version may initially be invisible to the user as a coherent whole.

Collation of the results may therefore provide a ranked list or poll of component versions by popularity (the number of times a component version has been chosen by unique users to be added to their own version of the computer model world). This may be used to aid user selection of component versions, reward users who submit popular component content and create a most-popular version for internal and/or future use.

When implementing a community vote, and as explained in relation to FIGS. 1A and 1C, the system may optionally override component selection by presenting a restricted set of components and/or component footprints to any of the users.

Depending on the application in question, a client may or may not have visibility of the updated component due to the suitability of the update for the particular application, for example, a game being executed. This limited distribution occurs when a model component, for example, a building, is appropriate for one in-game scenario but inappropriate for another. User created component updates within the context of game play, for example, destruction of a building due to a war-type scenario may also require limited distribution of the component update according to in-game time relative to other application servers executing the same application. It may be the case that an event has not occurred within the same application executed on a different application server and therefore does not warrant a particular component being updated in the same manner for all application servers running the same application. A further example of limited distribution is where different applications are running in parallel in the context of the model world, and their different scenarios result in some component updates being redundant, for example, it may be inappropriate for a car racing game to be set in a war zone. Hence, versioning as described above, can be implemented to allow parallel usage of the same base data and limited or prohibited update distribution.

As discussed above, the parameter descriptors stored in the local cache are rendered in real-time by the client and are scaled according to the resources available in the client execution environment. This may be infinite scaling or a one of many selection of scaling factors. In order to create as realistic a model environment as possible, the individual components, once rendered are projected into the terrain of the model environment so that they are positioned correctly with reference to the gradient of the terrain to avoid the effect of 'floating in mid-air' and allows higher fidelity for viewing roads close-up. Any section of a component that is not correctly aligned with the terrain is then stitched at the time of display in the client execution environment in real-time in order to create the effect of seamless integration with the model terrain template.

Figure 9:
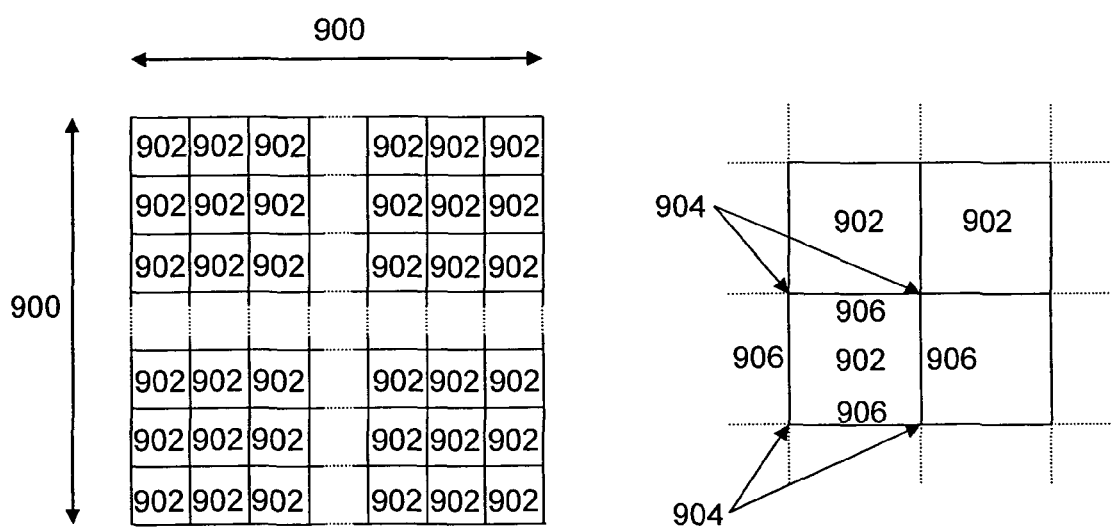
FIG. 9 shows a terrain tile and terrain cells.

The terrain within the model world is split into terrain tiles which in-turn are split into terrain cells. FIG. 9 illustrates an arbitrary terrain tile of size 900×900 comprising terrain cells 902 forming grid squares with cell vertices 904 and cell links 906 defined by a head and tail vertex. The size of a terrain cell is the distance between terrain height posts which equates to the size of the smallest terrain polygon in the highest detail level terrain tile. Hence for a terrain tile of 4 km$^2$, with height posts every 50 m, there are 80×80 terrain cells per terrain tile. As regards the gradient of the underlying terrain, when rendering roads for viewing from distance, the height of the road is found by sampling the terrain height at the road centre. The road is then elevated by, for example, 0.5 m to prevent the edges of the road component from intersecting with the underlying terrain.

In areas of extreme gradient, the road component may intersect with the terrain. When viewing roads from a distance, it is not noticeable that the roads are 'floating' above the underlying terrain. However, for viewing roads close-up, and for increased realism, higher fidelity is available. In summary, to generate the road and junction component outlines, road nodes and shape points are processed in to a list of road sections comprising a list of points that define sections of roads between junctions. The list of basic centreline points are then fed into a curve generation routine to produce a smooth hi-detail centreline (this may be tweaked to provide as many or as little points as required). Additional terrain heights are sampled if a road section is greater than 250 m. The centreline is then widened to produce a detailed left and right road edge.

Figure 10:
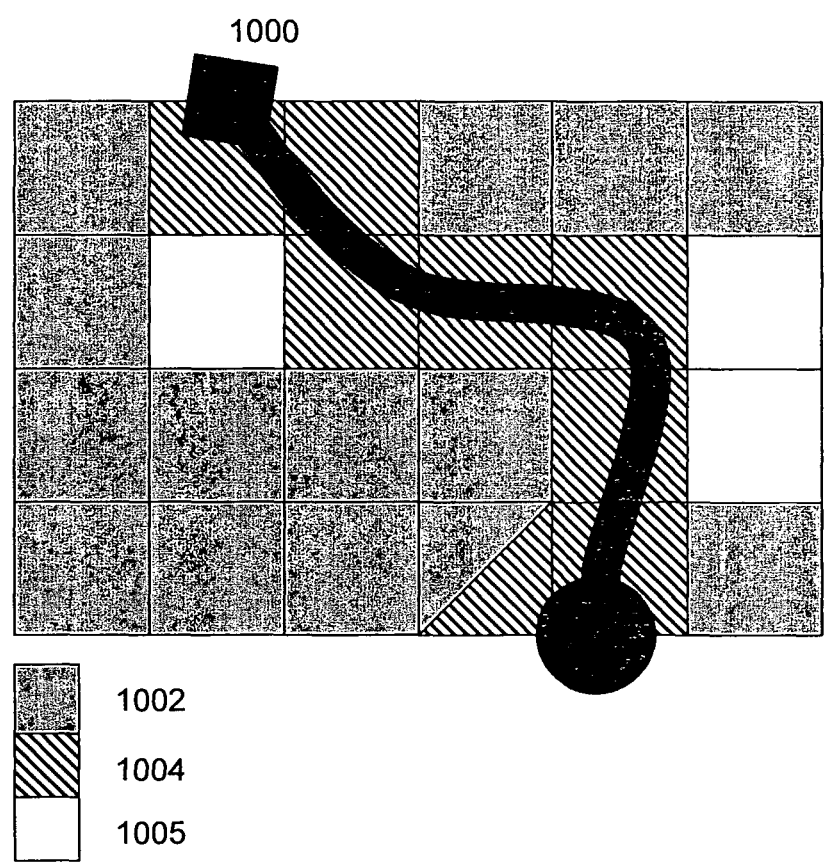
FIG. 10 shows a road component and underlying terrain.

In order to meld road and other components with the surrounding terrain at runtime, the stitching algorithm takes the outlines of model world components and cuts holes in the underlying terrain tiles in which the outline is positioned. The space between the edges of the component and the terrain geometry is then filled with auto-generated or melded terrain geometry. FIG. 10 illustrates a road component 1000 placed on a section of terrain. Terrain tiles 1002 remain untouched, tiles 1004 through which the road passes require cutting and tiles 1006 are close enough that they may be optionally cut to provide a smoother gradient between the road component and the neighbouring untouched terrain tiles 1002. The cut-out is preferably wider than the road component chunk to allow for a realistic gradient between the road component and the underlying terrain.

The road construction and stitching process adheres to a number of basic rules, namely:
  i. Roads maintain the same height across their width,
  ii. Road heights are sampled at the nodes and also at additional points along the length of the road if the road sections are very long, for example, every 250 m,
  iii. Roads will preferably not follow high frequency undulations in the underlying terrain; the curve fitting algorithm will smooth the undulations so the roads only follow major terrain undulations, and
  iv. Road junctions are only created where three or more roads share the same node.

Figure 11A:
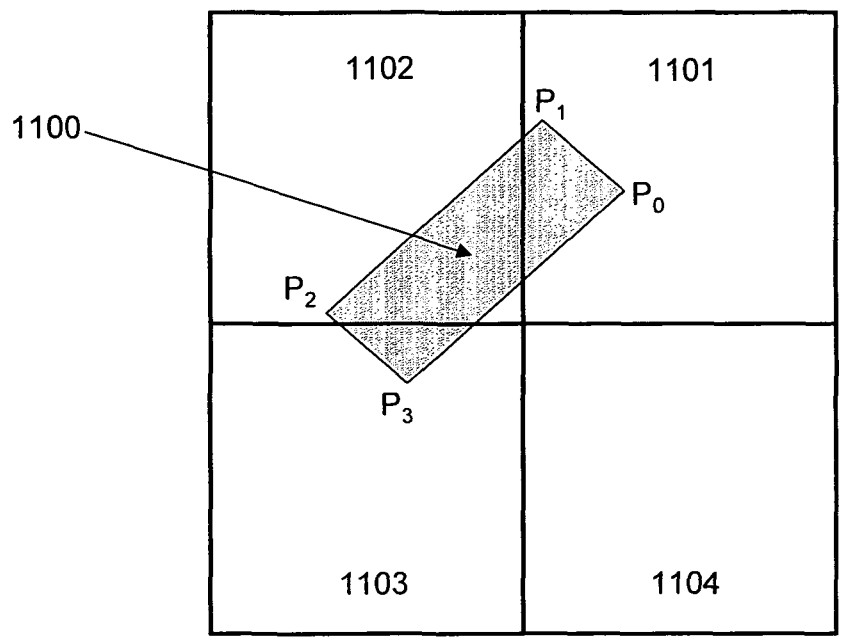
Figures 11B, 11C:
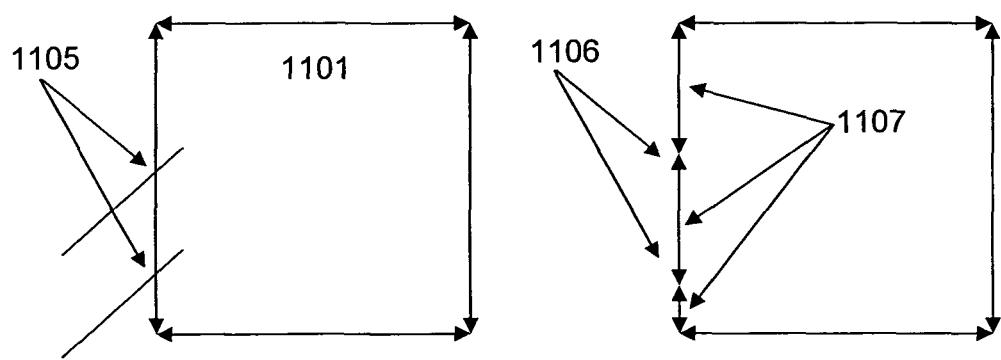
Figure 12:
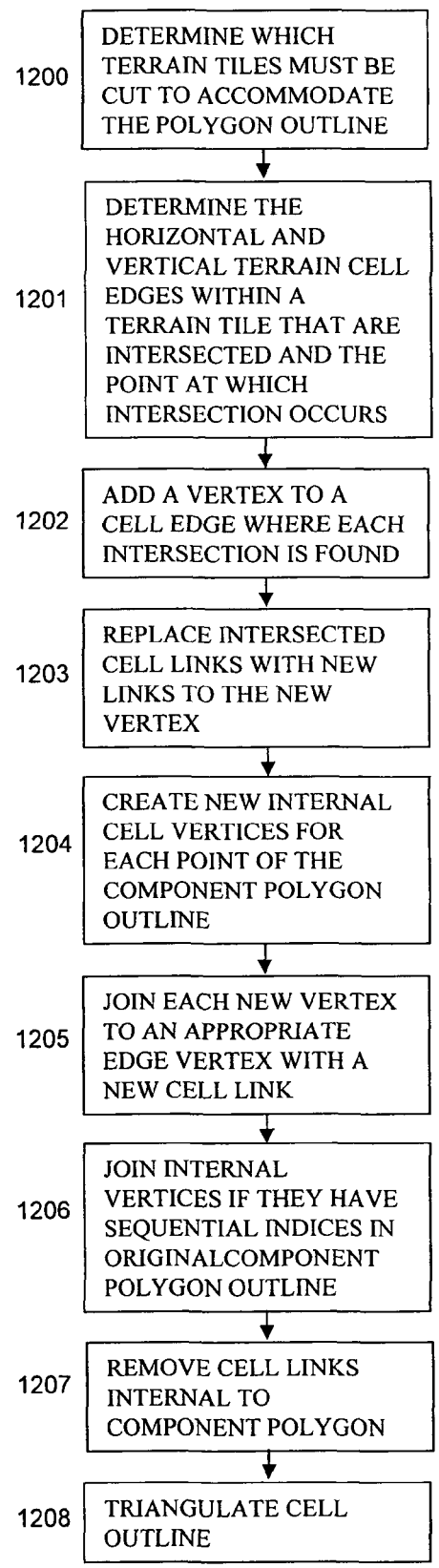
FIG. 12 shows a flow diagram of stitching a component to the underlying terrain.

FIGS. 11A to 11G illustrate the steps of stitching a component 1100 to the terrain in more detail. FIG. 11A shows a road component spanning four terrain cells 1101, 1102, 1103 and 1104. From FIG. 12, at step 1200 the algorithm determines which terrain tiles must be cut (in this case 1101, 1102, 1103 and 1104) to accommodate the polygon outline of the new stitched component geometry and then checks for overlaps between the component outlines and the terrain cell outlines within each of the terrain tiles by determining the horizontal and vertical terrain cell edges within a terrain tile that are intersected and the point at which intersection occurs at step 1201 (see also FIG. 11B, 1105). A vertex 1106 is added to a cell edge where each intersection is found at step 1202 and cell links being intersected are replaced by new links, 1107 to the new vertex at step 1203 (see also FIG. 11C). Whenever a new vertex is stored, extra information such as which component polygon outline points are at the head and tail of the line segment under test and which side of the line contains the inside of the component polygon is also determined and stored. At step 1204 new internal cell vertices, 1108 are created for each point of the component polygon outline (see also FIG. 11D) and at step 1205 each new vertex is joined to an appropriate edge vertex by creating a new cell link, 1109. Step 1206 joins this vertex to any other internal vertices if the points have sequential indices in the original component polygon outline (see also FIG. 11E, 1110). The above mentioned extra information stored at vertex creation time aids this decision. At step 1207, any cell links 1111 internal to the component polygon outline are removed (see also FIG. 11F) using the extra information and determining counting the number of splits, for example the links that have an even number of splits. This results in a single contiguous line without any splits or internal loops. Once the cut-out portion of the underlying terrain has been determined, at step 1208 the cell outline is triangulated using a standard triangulation routine resulting in a list of triangles (see also FIG. 11G) that may be added to the custom terrain geometry for that terrain tile and passed on to the terrain system for rendering. The joining of the triangles to the underlying terrain may be a simple straight line or other form of smoothing such as a curved 'S' shape. Shading and shadow mapping as per the standard terrain tiles may then be applied. Depending on the complexity of the underlying terrain, adjacent terrain proximal to a road component may also have to be cut to allow for stitching in the same manner as above.

During stitching, edge points from the outline of the feature are added to the cell and therefore become shared edge points for the custom terrain geometry. These shared edge points pull the terrain up or down in height (creating embankments and valleys) to match the position of the component in the model world. For the triangulation routine to function correctly, the component polygon outlines must not cross each other. Outlines may, however, join with other outlines at shared edges or vertices.

Any junctions are processed by trimming back the road ends and joining the left edge of one road with the right edge of its immediate neighbour at the junction hence generating a simple junction outline. This simple outline may be improved by adding a curve between the road ends, making it more like a sweeping corner. Both the road sections (that have been truncated to incorporate the junctions) and the junction outlines are then fed into the terrain stitching algorithm and processed as above. This alters the underlying terrain and creates holes that match precisely where the road and junction render models will be drawn.

A further enhancement of the transition from land to water is provided by Ordnance survey or other official data whereby vector format data containing hard edges for land and water is used to determine which side of the land-water transition any particular terrain pixel is placed.

Furthermore, placement data for buildings considered to be canonical may result in roads interpenetrating the building components. Road component constraints may therefore be relaxed to move them around the building components in order to provide a more realistic model world.

A further enhancement of the world model is achievable by collecting real-time physical world data from a plurality of sources, integrating it together and superimposing the data onto the model, for example, but not limited to, traffic and travel information, speed camera locations, house prices, positions of the sun, moon and stars, weather information and player position information. Abstract data, for example building function such as wine types in an off-licence or liquor store and similar ontological data may be extracted from real world resources such as business directories, and pushed to users (see FIG. 6 below). This information is available to clients executing applications in the context of the world server and rendered in the client execution environment. The complexity of the real-time and abstract data is scalable according to the client execution environment in the same manner as the parametric descriptors and is presented as meta-data attached to each resource of the model world.

Figure 6:
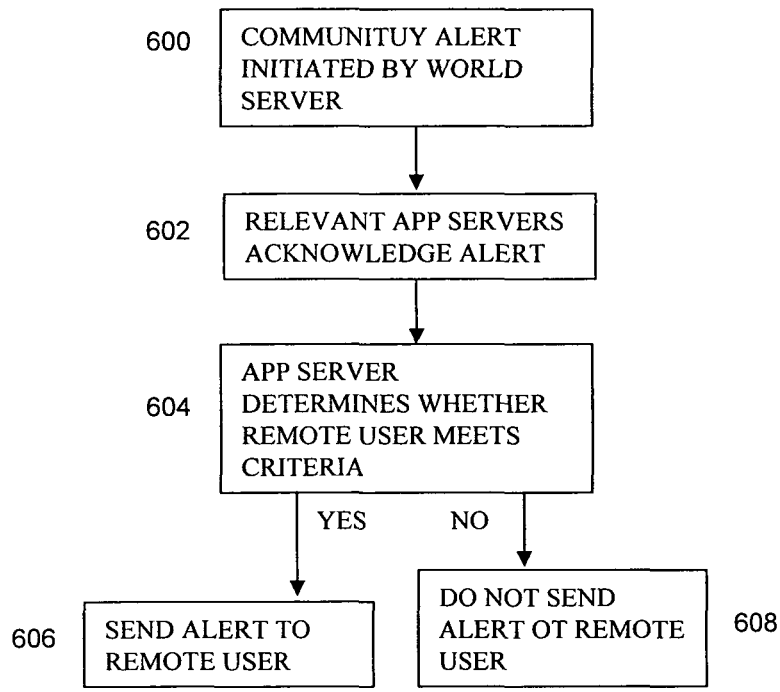
FIG. 6 shows a flow diagram of a community alert.

Referring to FIG. 6, there is shown a flow diagram of the method involved in pushing a community alert to qualifying remote users. The world server is able to initiate a community alert at step 600 relating to, for example but not limited to, the geographical or post-code location of the user within the model world, or entry onto a distribution list dependent on location information supplied by the user. The relevant application server responds with an acknowledgement of the community alert at step 602 and determines whether a remote user currently executing the application in the context of the model world meets the criteria for receiving the community alert at step 604. According to whether the criteria are met, the community alert is either sent to the remote user or not sent as appropriate at steps 606 or 608. A non-limiting example of a community alert that may be pushed to a relevant user is when a particular location is passed in the model world that is accurately mirroring the user's position in the real world, an alert relevant to the same location in the real world, such as promotional offers in retail outlets, may be pushed to the user via, for example, the user's PDA. Extra revenue and advertising opportunities are therefore available with this scheme of community alerts. Alternative possibilities include news items related to the location and information relevant to a user's play experience within one or more of the multiplayer games executing within the context of the model world. For example, progress within the current game, progress within other games, friends' progress within games and significant progress of other players within games can be relayed.

Figure 7:
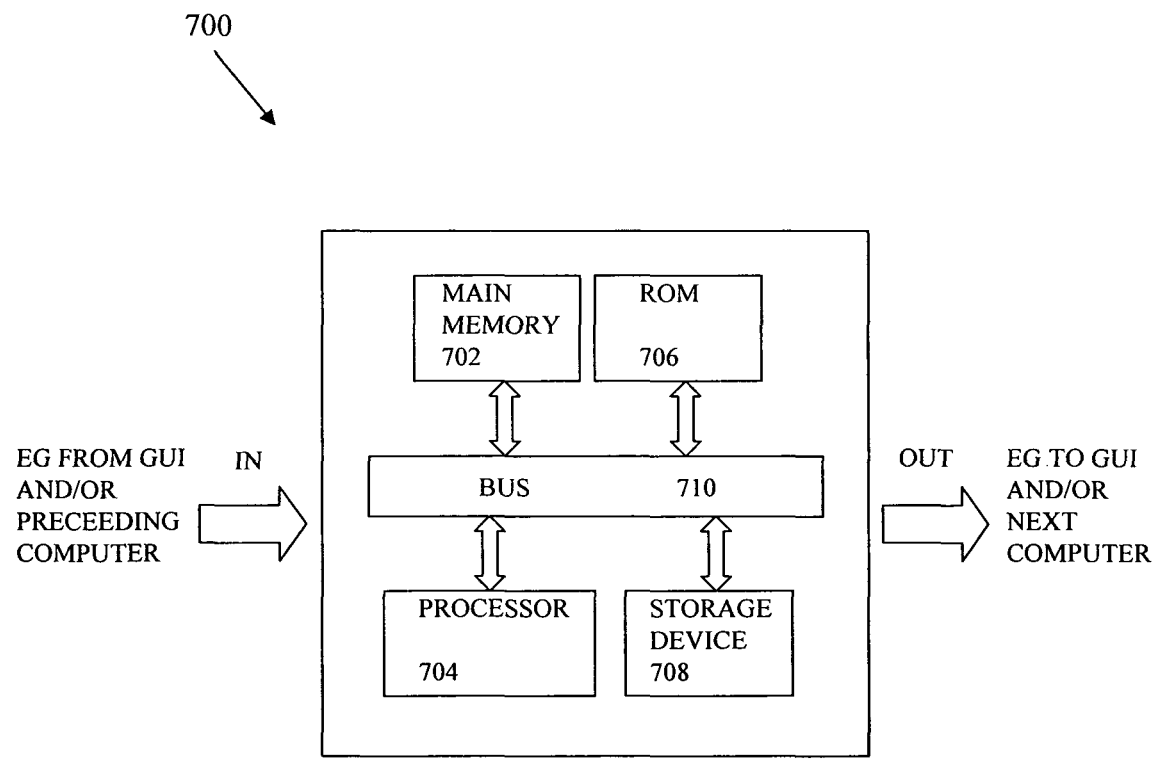
FIG. 7 shows a device capable of acting as a client/server.

Referring to FIG. 7, a device capable of acting as a client/server is shown comprising main memory 702 for storage of instructions and information to be executed by the processor 704, such as a random access memory (RAM), flash memory, or other dynamic storage device, ROM 706 or other static storage device, and storage device 708 such as a magnetic or optical disk, or flash memory, all coupled to a bus 710. Information arrives and leaves the device 700 from, for example a GUI operating on the device for direct user interaction or the preceding/next device in the client/server architecture. The originations/destinations may include a host, server, or other end station in a local network or Internet.

In the foregoing specification, the invention has been described with reference to specific embodiments thereof. It will, however, be evident that various modifications and changes may be made thereto without departing from the scope of the technique. The specification and drawings are, accordingly, to be regarded in an illustrative rather than a restrictive sense.

It is to be noted that the methods as described have shown steps being carried out in a particular order. However, it would be clear to a person skilled in the art that the order of the steps performed, where the context permits, can be varied and to that extent the ordering of the steps as described herein is not intended to be limiting.

It is also to be noted that where a method has been described it is also intended that protection is also sought for a device arranged to carry out the method and where features have been claimed independently of each other these may be used together with other claimed features.

The invention claimed is:

1. A method of executing a computer application in the context of a computer model comprising the steps of:
    retrieving computer model data corresponding to a computer model of a computer world from a model computer server,
    receiving, from a client computer device, information about resources available in an execution environment at the client computer device,
    in response to receiving the information from the client computer, generating scaled computer model data for a scaled computer model by scaling the computer model data based on the information about the resources available in the execution environment,
    determining whether the scaled computer model data is approved by a community of users;
    in response to determining that the scaled computer model data is approved by the community of users;
        retrieving application information from an application server, and
        executing said application information in the context of the scaled computer model in the execution environment,
    wherein the steps are performed by one or more computing devices.

2. The method of claim 1, further comprising applying economic value to transactions occurring within the executed application information, the method further comprising the steps of:
    retrieving transaction information from the model server,
    retrieving transaction information from the application server, retrieving execution information from the execution environment, retrieving economic information from an economy server, apportioning economic value to a transaction, and updating the execution environment with said economic value.

3. The method of claim 1, where the computer model is a model of a physical world, and the model server is a world server.

4. The method of claim 1, where:
the computer model data is modified from within the application information executed in the context of the model in the execution environment, and
the modified computer model data is populatable onto said model computer server.

5. The method of claim 1, in which a plurality of applications are executed in respective execution environments in the context of the computer model.

6. The method of claim 4, wherein the modified computer model data is retrievable only in the context of the application information execution in which it was modified.

7. The method of claim 4, wherein the modified computer model data is retrievable in the context of a plurality of applications executed in the context of a world model.

8. The method of claim 4, where the modified computer model data may be voted on by users of the application.

9. The method of claim 1, where the computer model data is lockable to prevent modification from within application information execution.

10. The method of claim 1, where the computer model data retrieved from the model server is selected according to a unique selection from each user execution environment.

11. The method of claim 1, where a plurality of versions of the computer model are stored.

12. The method of claim 11, wherein respective versions of the plurality of versions of the computer model correspond to respective applications.

13. The method of claim 11, wherein respective versions of the plurality of versions of the computer model correspond to versions of the computer model at different time instants.

14. The method of claim 1, further comprising caching computer model data corresponding to a version of the computer model at a cache location intermediate to the model server and the execution environment.

15. The method of claim 14, further comprising flagging any modification to the version of the computer model at the cache location for selective upload to the execution environment.

16. The method of claim 1, in which at least one of the model server, execution environment and application server comprise a localised or distributed server instance.

17. An apparatus comprising at least one processor and one or more stored sequences of instructions which, when executed by the at least one processor, cause the processor to:
retrieve computer model data corresponding to a computer model of a computer world from a model computer server,
receive, from a client computer device, information about resources available in an execution environment at the client computer device,
in response to receiving the information from the client computer, generate scaled computer model data for a scaled computer model by scaling the computer model based on the information about the resources available in the execution environment,
determine whether the scale computer model data is approved by a community of users;
in response to determining that the scaled computer model data is approved by the community of users;
retrieve application information from an application server, and
execute said application information in the context of the scaled computer model in the execution environment.

18. The apparatus of claim 17, storing additional sequences of instructions which, when executed by the at least one processor, cause the processor to:
retrieve transaction information from the model server,
retrieve transaction information from the application server,
retrieve execution information from the execution environment, retrieving economic information from an economy server, apportioning economic value to a transaction, and
update the execution environment with said economic value.

19. The apparatus of claim 17, where the computer model is a model of a physical world, and the model server is a world server.

20. The apparatus of claim 17, where:
the computer model data is modified from within the application information executed in the context of the model in the execution environment, and
the modified computer model data is populatable onto said model computer server.

* * * * *